(12) United States Patent
Koelmans et al.

(10) Patent No.: US 11,615,298 B2
(45) Date of Patent: Mar. 28, 2023

(54) STDP WITH SYNAPTIC FATIGUE FOR LEARNING OF SPIKE-TIME-CODED PATTERNS IN THE PRESENCE OF PARALLEL RATE-CODING

(71) Applicant: Samsung Electronics Co., Ltd., Suwon-si (KR)

(72) Inventors: Wabe W. Koelmans, Adliswil (CH); Timoleon Moraitis, Zurich (CH); Abu Sebastian, Adliswil (CH); Tomas Tuma, Adliswil (CH)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/692,491

(22) Filed: Mar. 11, 2022

(65) Prior Publication Data
US 2022/0198252 A1 Jun. 23, 2022

Related U.S. Application Data

(63) Continuation of application No. 15/590,530, filed on May 9, 2017, now Pat. No. 11,308,387.

(51) Int. Cl.
*G06N 3/063* (2023.01)
*G11C 11/54* (2006.01)
(Continued)

(52) U.S. Cl.
CPC .............. *G06N 3/063* (2013.01); *G06N 3/049* (2013.01); *G06N 3/08* (2013.01); *G06N 3/088* (2013.01);
(Continued)

(58) Field of Classification Search
CPC .......... G06N 3/063; G06N 3/049; G06N 3/08; G06N 3/088; G11C 11/54
See application file for complete search history.

(56) References Cited

U.S. PATENT DOCUMENTS

| 8,447,714 B2 | 5/2013 | Breitwisch et al. |
| 9,092,738 B2 | 7/2015 | Izhikevich et al. |

(Continued)

OTHER PUBLICATIONS

Tully et al. Spike-Based Bayesian-Hebbian Learning of Temporal Sequences. PLOS Computational Biology. May 23, 2016 (Year: 2016).*

(Continued)

*Primary Examiner* — Alexey Shmatov
*Assistant Examiner* — Robert Bejcek, II
(74) *Attorney, Agent, or Firm* — NSIP Law

(57) ABSTRACT

A circuit implementing a spiking neural network that includes a learning component that can learn from temporal correlations in the spikes regardless of correlations in the rates. In some embodiments, the learning component comprises a rate-discounting component. In some embodiments, the learning rule computes a rate-normalized covariance (normcov) matrix, detects clusters in this matrix, and sets the synaptic weights according to these clusters. In some embodiments, a synapse with a long-term plasticity rule has an efficacy that is composed by a weight and a fatiguing component. In some embodiments, A Hebbian plasticity component modifies the weight component and a short-term fatigue plasticity component modifies the fatiguing component. The fatigue component increases with increases in the presynaptic spike rate. In some embodiments, the fatigue component increases are implemented in a spike-based manner. In some embodiments, the Hebbian plasticity is a spike-timing-dependent plasticity (STDP), resulting in a fatiguing STDP (FSTDP) synapse.

15 Claims, 4 Drawing Sheets

(51) Int. Cl.
G06N 3/049 (2023.01)
G06N 3/08 (2023.01)
G06N 3/088 (2023.01)
G11C 13/00 (2006.01)

(52) U.S. Cl.
CPC .......... *G11C 11/54* (2013.01); *G11C 13/0004* (2013.01); *G11C 2013/0071* (2013.01); *G11C 2213/79* (2013.01)

(56) References Cited

U.S. PATENT DOCUMENTS

| | | | |
|---|---|---|---|
| 9,177,245 | B2 | 11/2015 | Richert et al. |
| 9,330,355 | B2 | 5/2016 | Rangan |
| 2004/0142368 | A1 | 7/2004 | Wesseling |
| 2010/0277232 | A1 | 11/2010 | Snider |
| 2013/0304447 | A1 | 11/2013 | Szatmary et al. |
| 2014/0122397 | A1 | 5/2014 | Richert et al. |
| 2014/0122398 | A1 | 5/2014 | Richert |
| 2014/0258194 | A1 | 9/2014 | Towal et al. |
| 2014/0351190 | A1 | 11/2014 | Levin et al. |
| 2015/0046382 | A1 | 2/2015 | Rangan |
| 2015/0074026 | A1 | 3/2015 | Szatmary et al. |
| 2018/0174040 | A1 | 6/2018 | Davies et al. |
| 2018/0330228 | A1 | 11/2018 | Koelmans et al. |
| 2019/0130258 | A1 | 5/2019 | Cappy et al. |

OTHER PUBLICATIONS

Guo et al. "Temporal Competitive Learning Induced in Neural Networks by Spike Timing-Dependent Plasticity" Proceedings of International Joint Conference on Neural Networks, Atlanta, Georgia, USA, Jun. 14-19, 2009.
Kreuz et al. "Time-resolved and time-scale adaptive measures of spike train synchrony" Journal of Neuroscience Methods 195 (2011) pp. 92-106.
Brader et al. "Learning Real-World Stimuli in a Neural Network with Spike-Driven Synaptic Dynamics" Neural Computation 19, 2881-2912 (2007). © 2007 Massachusetts Institute of Technology. pp. 2882-2912.
Froemke et al. "Temporal modulation of spike-timing-dependent plasticity" Review Article published: Jun. 17, 2010, vol. 2, Article 19, doi: 10.3389/fnsyn.2010. 00019 frontiers in SYNAPTIC (pp. 1-16).
Painkras et al. "SpiNNaker: A Multi-Core System-on-Chip for Massively-Parallel Neural Net Simulation" Published n: Custom Integrated Circuits Conference (CICC), 2012 IEEE San Jose, CA, USA Date of Conference: Sep. 9-12, 2012, Date Added to IEEE Xplore: Oct. 15, 2012, DOI: 10.1109/CICC-2012.6330636.
Qiao et al. "A reconfigurable on-line learning spiking neuromorphic processor comprising 256 neurons and 128K synapses" Frontiers in Nueroscience, www.frontiersin.org, Apr. 2015, vol. 9, Article 141. pp. 1-17, Original Research published: Apr. 29, 2015, doi: 10.3389/fnins.2015.00141.
Rosenbaum et al. "Short Term Synaptic Depression Imposes a Frequency Dependent Filter on Synaptic Information Transfer", (2012) Short Term Synaptic Depression Imposes a Frequency Dependent Filter on Synaptic Information Transfer. PLoS Comput Biol 8(6): e1002557. doi: 10.1371/journal.pcbi.1002557, pp. 1-18.
Seo et al. "A 45nm CMOS Neuromorphic Chip with a Scalable Architecture for Learning in Networks of Spiking Neurons" Published in: Custom Integrated Circuits Conference (CICC), 2011 IEEE. Date of Conference: Sep. 19-21, 011 San Jose, CA, USA Date Added to IEEE Xplore: Oct. 20, 2011 DOI: 10.1109/CICC.2011. 6055293.
Song et al. "Competitive Hebbian learning through spike-timing-dependent synaptic plasticity", Nature neuroscience, vol. 3 No. 9, Sep. 2000. pp. 919-926. © 2000 Nature America Inc.

Tsodyks et al. "The neural code between neocortical pyramidal neurons depends on neurotransmitter release probability", Proc. Natl. Acad. Sci. USAvol. 94, pp. 719-723, Jan. 1997 Neurobiology, all content was uploaded by Michail Tsodyks on Jun. 14, 2016, https://www.researchgate.net/publication/1419561. Article in Proceedings of the National Academy of Sciences—Feb. 1997 DOI: 10.1073/pnas.94.2.719, Source: PubMed.
Tuma et al. "Detecting Correlations Using Phase-Change Neurons and Synapses", IEEE Electron Device Letters, vol. 37, No. 9, Sep. 2016_ © 2016 IEEE. pp. 1238-1241.
Tuma et al. "Stochastic phase-change neurons" Nature Nanotechnology vol. 11, Aug. 2016, www.nature.com, 2016 Macmillan Publishers Limited. pp. 693-699. Published Online: May 16, 2016, DOI: 10.1038/NNAN0.2016.70.
Wang et al. "A 2-transistor/1-resistor artificial synapse capable of communication and stochastic learning in neuromorphic systems", Jan. 2015, vol. B, Article 438, pp. 1-11. www.frontiersin.org.
Abbott et al. "Homeostasis and Learning Through Spike-Timing Dependent Plasticity". Methods: Ind Models in Neurophysics, vol. 9110, No. 1, p. 22, 2004. [Online]. Available: http://citeseerx.ist.psu.edu/viewdoc/download?doi=10.1.1.5.7825&rep=rep1&type=pdf.
Ambrogio et al. "Unsupervised Learning by Spike Timing Dependent Plasticity in Phase Change Memory (PCM) Synapses" Frontiers in Neuroscience, www.frontiersin.org. Mar. 2016, vol. 10, Article 56. pp. 1-12.
Berdan et la, "Emulating short-term synaptic dynamics with memristive devices", www.nature.com/scientificreports, Scientific Reports 6:18639, DOI: 10.1038/srep18639. Published Jan. 4, 2016. pp. 1-9.
Bichler et al. "Unsupervised Features Extraction from Asynchronous Silicon Retina through Spike-Timing-Dependent Plasticity", Proceedings of International Joint Conference on Neural Networks, San Jose, California, USA, Jul. 31-Aug. 5, 2011.
Cai et al. "Neuronal Synapse as a Memristor: Modeling Pair-and Triplet-Based STOP Rule". IEEE Transactions PN Biomedical Circuits and Systems, vol. 9, No. 1, Feb. 2015. pp. 87-95. oi:10.1155/2012/968272.
Fernando et al. "Spike-Timing-Dependent Plasticity and Short-Term Plasticity Jointly Control the Excitation of Hebbian Plasticity Without Weight Constraints in Neural Networks". Hindawi Publishing Corporation Computational Intelligence and Neuroscience vol. 2012, Article ID 968272, 15 pages.
Gilson et al. "STDP Allows Fast Rate-Modulated Coding with Poisson-Like Spike Trains", PLoS Computational Biology, www.ploscompbiol.org. Oct. 2011, vol. 7, Issue 10, e1002231. pp. 1-19.
Gutig et al. "Learning Input Correlations through Nonlinear Temporally Asymmetric Hebbian Plasticity", The Journal of Neuroscience, May 1, 2003, • 23(9):3697-3714 pp. 3697-3714, http://www.ncbl.nlm.nlh.gov/pubmed/12736341.
Indiveri et al. "Memory and Information Processing in Neuromorphic Systems", vol. 103, No. 8, Aug. 2015, Proceedings of the IEEE. pp. 1379-1397. http://www.ieee.org/publications/standards/publications/rights/index.
Indiveri et al. "Neuromorphic Architectures for Spiking Deep Neural Networks", IEDM15-69. © 2015 IEEE. pp. 4.2.1-4.2.4, Dec. 7-9, 2015, Washington, D.C. 101109/IEDM.2015.7409623_.
Kempter et al. "Hebbian learning and spiking neurons", Physical Review E. vol. 59, No. 4. Apr. 1999, pp. 4498-4514.
Masquelier et al. "Spike Timing Dependent Plasticity Finds the Start of Repeating Patterns in Continuous Spike Trains", PLoS ONE, www.plosone.org, Jan. 2008, Issue 1, e1377, pp. 1-9.
Merolla et al. "A million spiking-neuron integrated circuit with a scalable communication network and interface", Science Aug. 8, 2014, vol. 345 Issue 619. sciencemag.org, DOI: 10.1126/science. 1254642, pp. 668-673.
Morrison et al. "Phenomenological models of synaptic plasticity based on spike timing" Biological Cybernetics Biol Cybern, (2008) 98:459-478 DOI 10.1007/s00422-008-0233-1, Accepted: Apr. 9, 2008 © il he Author(s) 2008. pp. 459-478.
Ohno et al. "Short-term plasticity and long-term potentiation mimicked in single inorganic synapses", Nature Materials, vol. 10, Aug. 2011, www.nature.com/naturematerials, 2011 Macmillan Publishers Limited, pp. 591-595.

(56) References Cited

OTHER PUBLICATIONS

List of IBM Patents or Patent Applications Treated as Related, Filed Apr. 11, 2019, 2 pages.
List of IBM Patents or Patent Applications Treated as Related, Filed Feb. 5, 2018, 2 pages.

* cited by examiner

STDP WITH SYNAPTIC FATIGUE FOR LEARNING OF SPIKE-TIME-CODED PATTERNS IN THE PRESENCE OF PARALLEL RATE-CODING

BACKGROUND

The present invention relates to the technical field of artificial intelligence. In particular, the present invention relates to spike-timing-dependent plasticity (STDP) in neurons.

Neurons are electrically excitable cells that process and transmit information around the nervous system. Neurons are a primary component of the brain and spinal cord in vertebrates, and are a primary component of the ventral nerve cord in invertebrates. These neurons include a nucleus that is comprised of a soma, an axon, and a dendrite. The soma acts as a processing unit for neuronal signals and is responsible for generating action potentials (i.e., electrical signals or potentials). The action potentials are propagated from the soma, through an axon, to the end of the neuron, or axon terminal. In the axon terminal, chemical neurotransmitters that encode the electrical signal are produced. These chemical neurotransmitters cross a gap between the axon terminal and a dendrite of another neuron. This gap is part of the connection system of two neurons and is referred to as a synapse. Synapses can be characterized by their synaptic plasticity. Synaptic plasticity is the ability of a synapse to strengthen or weaken over time in response to inputs.

Neural networks are a computational model used in artificial intelligence systems. Neural networks are based on multiple artificial plastic neurons, which are analogous to the axons in the human brain. Each artificial neuron is connected with many others, and links can enhance or inhibit the activation state of adjoining neural units. Artificial neurons, in some embodiments, compute using summation functions, and there may be a threshold function or limiting function on each connection and on the artificial neuron itself, such that the signal must surpass the limit before propagating to other artificial neurons. This thresholding is a key component of the spiking neural network (SNNs).

SNNs are algorithms that underlie the brain's function, and their implementation as a collection of artificial neurons. Many SNNs are loosely based on biological neurons, and the action potentials of biological neurons are modeled as spikes. These SNNs learn from input data whose features are encoded as streams of spikes. These networks have applications in unsupervised learning through detecting correlations across the features of the input. One aspect of the artificial neuron that leads to learning correlation is the Hebbian plasticity, i.e. a class of synaptic plasticity rules that modify synapses according to pre- and post-synaptic activity. Spike-timing-dependent plasticity (STDP) is a Hebbian synaptic plasticity rule that can allow an SNN to learn from correlations in the timing of individual spikes across input features, by detecting clusters in the covariance matrix of the inputs. These networks can use the timing of the spikes to learn.

However, STDP is rate-sensitive, meaning that in conventional neural networks, STDP learns from correlations in rate. If, in addition to correlations of individual spike timings there are correlations in the input rates, which are not relevant to the task, STDP may learn from the rates and not from the timings. Thus, for tasks where correlations in timing but not rate are wanted, neurons with only a spike-timing-dependent plasticity often fail.

SUMMARY

In a first aspect of the present invention, an apparatus includes: at least one presynaptic artificial neuron generating a sequence of presynaptic spikes having a timing, a postsynaptic artificial neuron comprising a membrane potential, a learning rule component comprising a synaptic efficacy and a synaptic plasticity, and the learning rule configured to modify the synaptic efficacy by a learning rule. The learning rule is based on the timing and discounts presynaptic spike rates.

In a second aspect of the present invention, an apparatus includes: at least one presynaptic artificial neuron generating a sequence of presynaptic spikes, a postsynaptic artificial neuron including a postsynaptic membrane potential and at least one fatiguing plastic synapse connected to the postsynaptic membrane potential. The postsynaptic artificial neuron configured to receive the set of spikes. The at least one fatiguing plastic synapses includes an efficacy having a spike-timing-dependent plasticity and a fatiguing component. The fatiguing component reduces the efficacy based on the set of input spikes.

In a third aspect of the present invention, an apparatus includes: at least one presynaptic artificial neuron, configured to generate a sequence of presynaptic spikes, a postsynaptic artificial neuron including a postsynaptic membrane potential and at least one plastic synapse configured to receive the set of spikes and to modify the postsynaptic membrane potential. The at least one plastic synapse learns based on a normalized covariance of the sequence of presynaptic spikes.

According to an aspect of the present invention, there is a method, computer program product and/or that performs the following operations (not necessarily in the following order): (i) providing, by machine logic, at least one presynaptic artificial neuron generating a sequence of presynaptic spikes having a timing; (ii) providing, by the machine logic, a postsynaptic artificial neuron comprising a membrane potential; (iii) providing, by the machine logic, a learning rule component comprising a synaptic efficacy and a synaptic plasticity; and (iv) providing, by the machine logic, the learning rule component configured to modify the synaptic efficacy by a learning rule. Wherein the learning rule is based on the timing and discounts presynaptic spike rates. Wherein the learning rule comprises either: (i) a normalized covariance component configured to generate a normalized covariance matrix based on the sequence of presynaptic spikes and a clustering component configured to modify the synaptic efficacy according to clusters in the normalized covariance matrix, or (ii) at least one plastic synapse that is operatively connected to the at least one presynaptic artificial neuron to receive the sequence of presynaptic spikes and modify the postsynaptic membrane potential based on the synaptic efficacy and the sequence of presynaptic spikes. Wherein the synaptic efficacy comprises a weighting and a rate-normalization, and wherein the at least one plastic synapse comprises a Hebbian plasticity component configured to modify the weighting, and a rate-dependent plasticity component configured to modify the rate-normalization. Wherein the Hebbian plasticity component comprises a spike-timing-dependent plasticity rule. Wherein the rate-dependent plasticity component comprises a fatigue plasticity rule. Wherein the sequence of presynaptic spikes is characterized by a spike rate and the fatigue plasticity rule is configured to modify the rate-normalization so that each spike in the sequence of presynaptic spikes has a reduced effect on the membrane potential when the spike rate increases. Wherein the at least one plastic synapse comprises either: (i) a non-volatile memory element with volatile characteristics that match the fatigue plasticity rule, or (ii) a digital complementary metal-oxide semiconductor (CMOS) circuit or an analog CMOS circuit.

BRIEF DESCRIPTION OF THE DRAWINGS

So that the manner in which the above recited features of the present invention can be understood in detail, a more particular description of the present invention, briefly summarized above, may be had by reference to embodiments, some of which are illustrated in the appended drawings. It is to be noted, however, that the appended drawings illustrate only typical embodiments of the present invention and the present invention may admit to other equally effective embodiments.

Figure 1A:
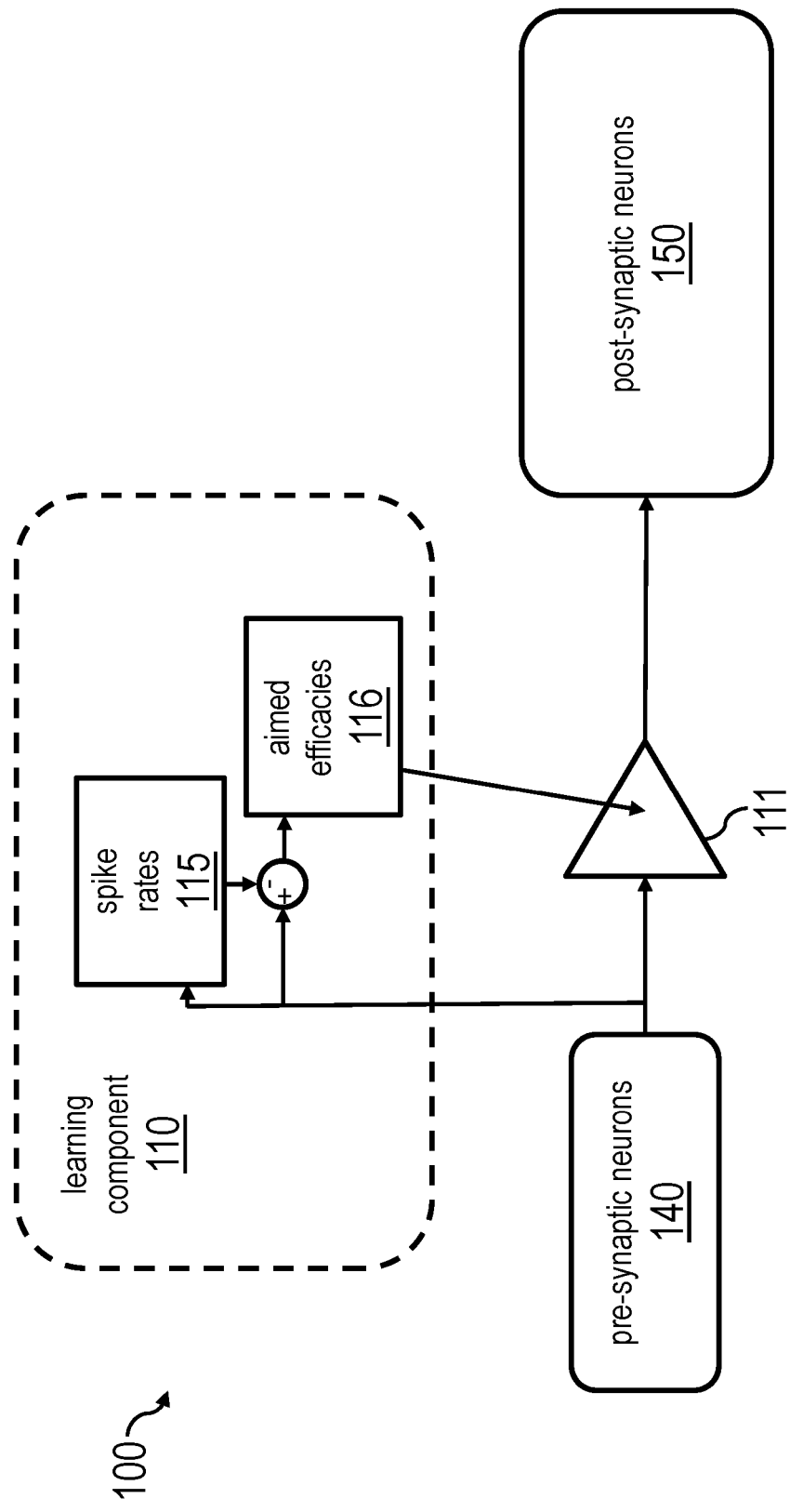
FIG. 1A illustrates a circuit implementing a neural network with a learning rule with a rate-discounting element, according to an embodiment of the present invention.

Other features of the present embodiments will be apparent from the Detailed Description that follows.

DETAILED DESCRIPTION

In the following detailed description of the preferred embodiments, reference is made to the accompanying drawings, which form a part hereof, and within which are shown by way of illustration specific embodiments by which the present invention may be practiced. It is to be understood that other embodiments may be utilized and structural changes may be made without departing from the scope of the present invention. Electrical, mechanical, logical and structural changes may be made to the embodiments without departing from the spirit and scope of the present teachings. The following detailed description is therefore not to be taken in a limiting sense, and the scope of the present disclosure is defined by the appended claims and their equivalents.

The methods and systems disclosed herein may be implemented in any means for achieving various aspects, and may be executed in a form of a machine-readable medium embodying a set of instructions that, when executed by a machine, cause the machine to perform any of the operations disclosed herein. These and other features, aspects, and advantages of the present invention will become readily apparent to those skilled in the art and understood with reference to the following description, appended claims, and accompanying figures, the present invention not being limited to any particular disclosed embodiment(s).

Described herein is an artificial neuronal circuit that learns from temporal correlations in the timings of input spikes even in the presence of additional correlations in the spike rates. The learning rule can be based on a normalized covariance (normcov) matrix of the inputs. A synaptic plasticity rule is also described, which, in aspects, comprises a rate-normalizing component in the plastic synapses, and a Hebbian or anti-Hebbian plasticity component. The synaptic plasticity rule can be implemented by a spike-timing-dependent plasticity rule that comprises a "synaptic fatigue" type of plasticity. This synaptic plasticity rule can implement the normcov-based learning To learn from temporal correlations regardless of the spike rate, a neural network that encompasses an element that discounts the influence of spike rates in the learning is introduced.

In one implementation of this learning rule, synapses are modified according to the normalized covariance matrix. The normalized covariance defined as:

$$normcov(X_i, X_j) = E\left[\frac{X_i}{E[X_i]} \cdot \frac{X_j}{E[X_j]}\right],$$

where $X_i$ and $X_j$ are two input streams. Synapses that correspond to the cluster of strongly covarying inputs are potentiated according to normcov.

Additionally, a Hebbian synaptic plasticity rule that comprises a rate-normalizing component is described. Rate normalization in this context means that the normalization of postsynaptic effects of presynaptic spikes is according to the presynaptic spike rate. The rate-normalizing component can be accommodated by synaptic fatigue. Synaptic fatigue in biology is the temporary reduction in the efficacy of a synapse for a time window immediately following an event which was input to the synapse. This reduces the probability that high frequency streams will cause the post-synaptic neuron to spike, and leaves synapses that receive low frequency streams relatively uninfluenced.

Spike-timing-dependent plasticity potentiates synapses that receive input which is causally linked to the post-synaptic spikes. Thus, a fatiguing synapse enables the detector to properly function even when the correlated input streams are of relatively low-frequency, by eliminating those causal links between pre-synaptic and post-synaptic events that would be merely due to the high pre-synaptic frequency of uncorrelated synapses, without influencing the synapses that receive low-frequency but correlated event streams.

In an embodiment, an apparatus comprises a presynaptic artificial neuron generating a first set of spikes, a postsynaptic artificial neuron comprising a postsynaptic membrane potential and generating a second set of spikes, and a fatiguing plastic synapse operatively connected to the presynaptic artificial neuron to receive the first set of spikes and configured to modify the postsynaptic membrane potential based on a fatiguing component and a spike-timing-dependent plasticity.

In a preferred embodiment, the fatiguing plastic synapse comprises a spike-timing-dependent plasticity. In a further preferred embodiment, the first set of spikes is characterized by an input rate and the fatiguing component is configured to reduce the postsynaptic membrane potential when the input rate increases. In an optional embodiment, the fatiguing component comprises a fatiguing rule:

$$(t) = 1 - 1/(R(t) + 1),$$

wherein $R(t)$ is a rate component.

In an advantageous embodiment, the rate component is a mean over a time window. In an optional embodiment, the fatiguing component comprises a fatiguing rule:

$$F(t) = f(t - t^{sp_n}) + F(t^{sp_n}),$$

where $t^{sp_n}$ is the timing of the last presynaptic spike prior to t.

In other optional embodiments:

$$f(x) = \begin{cases} a, & 0 < x < x_{window} \\ 0, & x \geq x_{window} \end{cases}, a \in (0, 1],$$

$$f(x) = 1 - ax, a > 0, \text{ or}$$

$$f(x) = 1 - ae^{-x}, a > 0.$$

In an alternative embodiment, the fatiguing plastic synapse comprises a transistor having a gate input, wherein the set of presynaptic spikes are input into the gate so as to modify the amount of current passing through the transistor. In a preferred embodiment, modifying the amount of current passing through the transistor is in accordance with a fatigue rule.

Numerous other embodiments are described throughout herein. All of these embodiments are intended to be within the scope of the present invention herein disclosed. Although various embodiments are described herein, it is to be understood that not necessarily all objects, advantages, features or concepts need to be achieved in accordance with any particular embodiment. Thus, for example, those skilled in the art will recognize that the present invention may be embodied or carried out in a manner that achieves or optimizes one advantage or group of advantages as taught or suggested herein without necessarily achieving other objects or advantages as may be taught or suggested herein.

In a set of event streams, the timing of events may be correlated across certain streams. Detection of the subset of correlated streams has numerous applications. An artificial spiking neuron's synapses equipped with STDP can be used to detect this correlation if the streams are of roughly equal and constant mean frequencies. This detection is possible because synapses receiving correlated streams of events tend to be potentiated, i.e. strengthened, while synapses receiving uncorrelated streams of events tend to be depressed, i.e. weakened. Thus correlation detection is done through synaptic strength. However, if some uncorrelated streams are of high mean frequency relative to the correlated ones, this neurosynaptic correlation detector can yield false results, as synapses receiving high input frequencies are more likely to be potentiated than synapses with low input frequency.

STDP refers to a neuronal characteristic for which the efficacy of synaptic transmission is influenced by a relative timing between presynaptic and postsynaptic stimulation. That is, the efficacy is affected by the timing of a presynaptic action potential and a postsynaptic potential. STDP has also become a principal experimental protocol for inducing change in synaptic plasticity.

The strength of a synapse is related to a magnitude of a change in postsynaptic current. Changes in synaptic strength can be short term (short term potentiation/depression, or STP/STD), which causes no permanent structural changes in the neuron's synapse. Typically, this change lasts a few seconds to minutes. Alternatively, changes in synaptic strength can also be long term (long term potentiation/depression, or LTP/LTD). LTP can cause permanent of semi-permanent changes of the synaptic weight, and are typically dependent on the relative timing of pre- and post-synaptic spikes ($\Delta t = t_{pre} - t_{post}$). For these long-term changes, repeated or continuous synaptic activation results in an alteration of the structure of the synapse itself. Learning and memory are believed to result from long-term changes in synaptic strength. A neuron equipped with STDP synapses can learn to recognize consistent spatiotemporal spike patterns (e.g. Song et al., 2000; Gütig et al., 2003; Masquelier et al., 2008).

Synaptic fatigue is a form of short-term plasticity (STP). Changes synaptic efficacy transiently. STP is observed in biological synapses as depletion of the neurotransmitter in the pre-synaptic terminal by each transmitted spike, and subsequent gradual replenishment. STDP can learn spike timing patterns, but not in the presence of rate coding. Fatiguing spike-timing-dependent plasticity (FSTDP) is a long-term synaptic plasticity rule which employs short-term synaptic fatigue and long-term STDP to learn precisely-timed spike patterns, discounting the influence of pre-synaptic spike rates on learning.

The shapes of action potentials at synapses are carefully modeled by the voltage responses propagated through axon and dendrite. Synaptic plasticity, the ability of connections between neurons to change in strength, can be viewed as an underlying mechanism of learning and memory. Spike-timing-dependent plasticity refers to the phenomenon, in which the synaptic weight can either be long term potentiated (LTP) or depressed (LTD), depending on the relative timing between presynaptic and postsynaptic spikes.

The concept of synaptic strength leads to the concept of a strong synapse as opposed to a weak synapse. For a strong synapse, an action potential in the presynaptic neuron triggers another action potential in the postsynaptic neuron. Conversely, for a weak synapse, an action potential in the presynaptic neuron may not trigger another action potential in the postsynaptic neuron. In other words, for a weak synapse, an excitatory postsynaptic potential in the postsynaptic neuron may not reach the threshold for action potential initiation in the postsynaptic neuron.

Thus, synaptic plasticity refers to an ability of the synaptic strength between two neurons to change. The above-described synaptic plasticity refers to and results in long term changes in the synaptic strength of a synapse, either long term potentiation (LTP) or long term depression (LTD).

However, challenges arise in cases of significant rate variability. Timing of events recorded by sensors is rich in information, but it is often combined with differences in the events' rate over time or across sensors. Research has shown that rate dominates STDP and that spike-time-coding is equivalent to rate-coding for slow modulation of rate (Kempter et al., 1999). Furthermore, STDP allows fast rate-modulated coding with Poisson-like spike trains (Gilson et al., 2011). In other words, STDP prohibits spike-time coding when the rate is modulated.

FIG. 1A illustrates a network 100 learning from spike inputs while discounting the influence of input spike rates, according to an embodiment of the present invention. The network 100 comprises at least one pre-synaptic neuron 140, at least one post-synaptic neuron 150, and at least one synapse 111 with a synaptic efficacy. The network 100 can learn temporal correlations in input spikes from the pre-synaptic neuron regardless of the input rates. Each input has timed spikes and may have added rate-dependent spikes. Some inputs are spike-timing-correlated. The learning rule component 110 outputs a set of aimed efficacies 116 during operation of the network. The learning rule component 110 comprises a spike-rate component 115. The spike-rate component 115 computes the rates of the presynaptic input spikes. The learning rule component 110 sets the aimed weights 116 according to the input spikes after discounting the spike-rate component 115.

Learning a task from a spike-timing code consists of learning to detect the temporal correlations across the streams that carry the code. Therefore, in a spiking neural network, the neurons need to learn to associate the strongly covarying inputs. This can be well illustrated as the discovery of clusters of high covariance in the covariance matrix of the input synapse pairs. In STDP, a neuron approximates this by potentiating, i.e., strengthening, and depressing, i.e., weakening, the synapses whose input shows high and low covariance respectively with the neuron's own output, i.e. the weighted sum of the input streams. This is a good approximation because inputs that covary strongly with the neuron's output which they drive likely covary strongly with one another. So covariances between inputs define the learning task, and covariances of the inputs with the sum of all inputs set a prediction for the neuron's optimal approximation to the task. The neuron's STDP synapses compare the inputs directly with the neuron's output, so a neuron's learning is sensitive specifically to the uncentered covariance of the inputs. If in addition to the covariances introduced by the correlations in timings of individual spikes there are covariances introduced by correlations in the rates of the inputs, these rate-induced covariances dominate the uncentered covariance, because of the spurious correlations of individual spike timings that are added by the slower covarying rates. To detect the fast covariances in the presence of the slow ones, individual spikes from high-rate channels must contribute less to the computed covariance than those from low-rate channels.

Figure 1B:
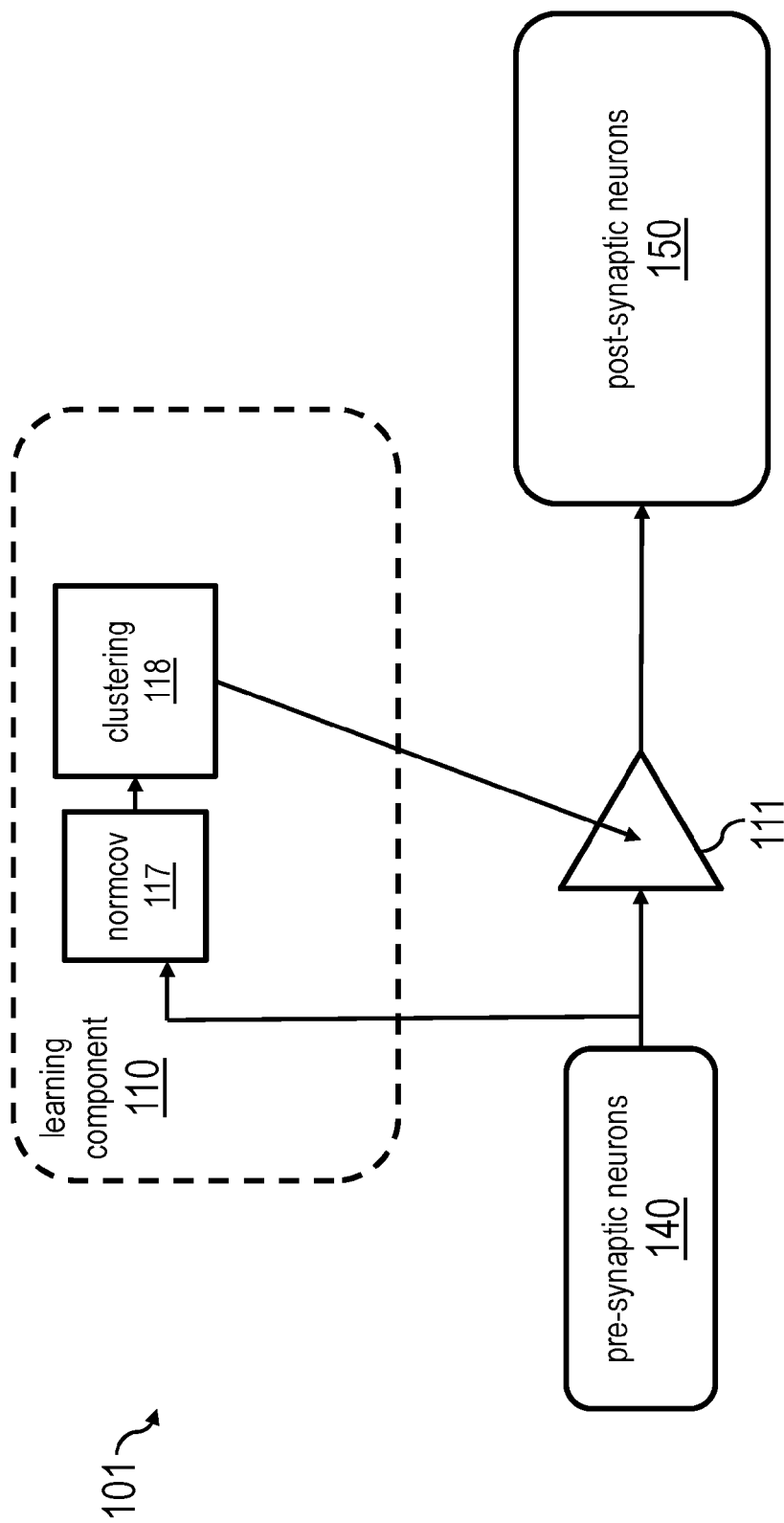
FIG. 1B illustrates a circuit implementing a normcov-based learning neural network, according to an embodiment of the present invention.

FIG. 1B illustrates a network 101 configured with a learning rule component 110 that outputs the aimed synaptic efficacies according to clusters found in the normalized covariance (normcov) matrix of the inputs, according to an embodiment of the present invention. In this embodiment, the normcov component 117 of the learning rule component 110 calculates the normcov. The output of the normcov component 117 is then clustered by a clustering component 118, which modifies the at least one synaptic efficacy component 111. The normcov component 117 computes the normcov and sets the synaptic efficacies component 111 according to clusters found in the normalized covariance (normcov) matrix of the inputs. At least one pre-synaptic neuron 140 and at least one post-synaptic neuron 150 are connected to the at least one synaptic efficacy component 111. For a neuron to learn a spike-timing code in the presence of a rate code, a modified STDP rule is needed. Ideally, this rule should approximate the learning of covariances of rate-normalized inputs via learning the covariances of rate-normalized inputs with the neuron's own output. In this disclosure, an STDP rule that includes a component that normalizes the postsynaptic contributions of each presynaptic spike by an increasing function of the recent rate is introduced. The rule is referred to as fatiguing STDP (FSTDP), because the rate normalization component is a synaptic fatigue mechanism, which can be combined with STDP. FSTDP can be used to implement normcov-based learning. Therefore, FSTDP can be used to implement spike-timing-based learning that discounts rate-correlations.

Synaptic fatigue has some postsynaptic effects. In particular, it reduces the effect of pre-synaptic input on the post-synaptic membrane potential when the input rate increases. Synaptic fatigue can be implemented in a spike-based manner by reducing the effect of a presynaptic spike on the postsynaptic neuron if the spike arrives soon after a previous one. Synaptic fatigue can be represented as:

$$\Delta V_{mem}^{sp_n} = A \cdot G(t),$$

with $G(t) = W(t) \cdot [1 - F(t)]$, and $F(t) = f(t - t^{sp_{n-1}}) + F(t^{sp_{n-1}})$, where A is a fixed term specific to a pair of pre- and post-synaptic neurons. G(t) is the synaptic efficacy, W is the weight, f(x) is a decreasing function. In many cases, G(t) tends to W in the long term. However, W is uninfluenced by the fatigue.

Figure 1C:
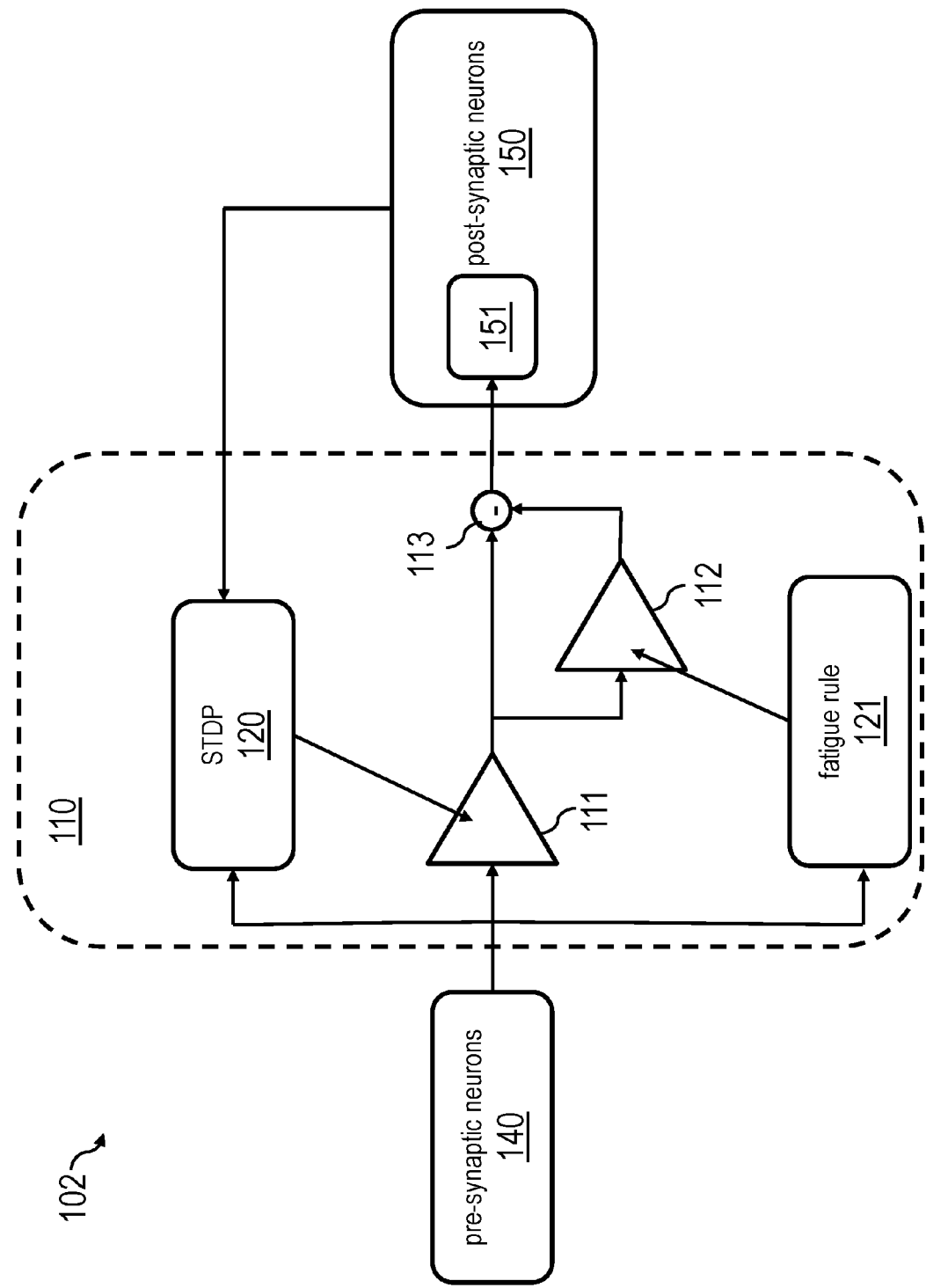
FIG. 1C illustrates a circuit implementing an FSTDP synapse, according to an embodiment of the present invention.

FIG. 1C illustrates a circuit 102 implementing an FSTDP neuron, according to an embodiment of the present invention. In this circuit, a presynaptic neuron 140 is connected to the synapse 110, which is in turn connected to the post-synaptic neuron. The pre-synaptic neuron generates a series of spikes. The spikes are received by the weight component 111 of the synapse 110. The output of the weight component 111 is received at the input of the fatiguing component 112. The output of the fatiguing component 112 is subtracted from the output of the spike-timing-dependent plasticity component 111 at the difference component 113. The output of the difference component is received in the membrane potential 151 of the post-synaptic neuron. The synaptic fatigue causes the synaptic efficacy to be given by $G(t)=W(t)[1-F(t)]$, where G(t) is the efficacy, W(t) denotes the stored synaptic weight, and F(t) is a function that depends on the time of arrival of the presynaptic spikes. An STDP component 120 modifies the weight component 111 according to the timing of spikes from the pre- and the post-synaptic neurons. A fatigue rule component 121 modifies the fatiguing component 112 according to the function F(t). In the absence of presynaptic spikes, F tends to zero as t tends to infinity and thus, $G(t) \rightarrow W(t)$. F(t) can be implemented, in an embodiment, in a spike-based way as a function that increases its value by a fixed amount upon the arrival of a presynaptic spike and decays exponentially.

Figure 2:
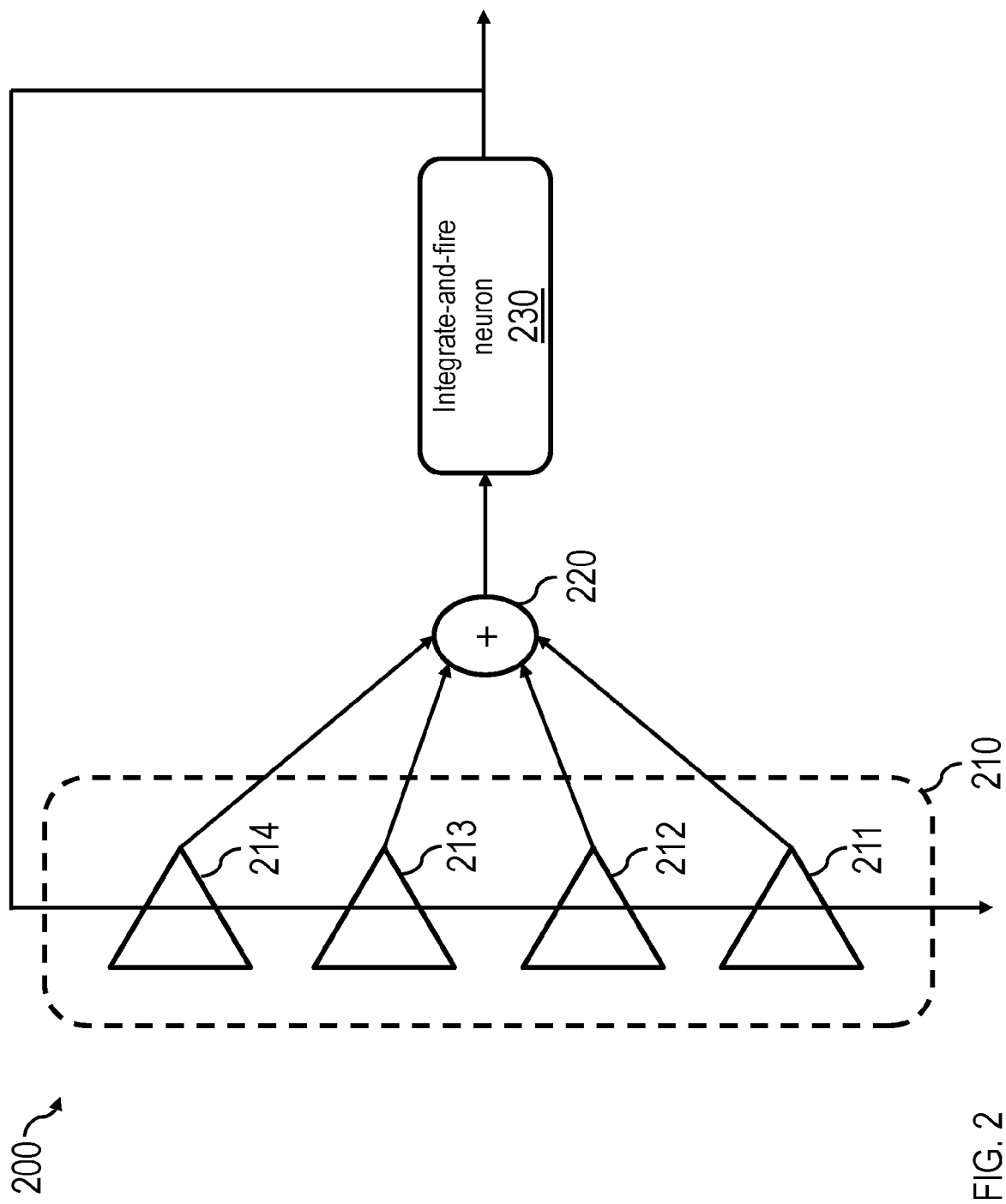
FIG. 2 illustrates a device having an integrate-and-figure neuron with a set of FSTDP synapses attached.

FIG. 2 illustrates a device 200 having an integrate-and-fire neuron 230 with a set 210 or array of fatiguing plastic synapses 211-214 attached. The integrate-and-fire neuron 230 equipped with the set of plastic synapses 211-214 and an FSTDP learning rule can be used to detect temporal correlations between event-based data streams. Each event arrives as a spike at a corresponding synapse 211-214, and a postsynaptic potential is generated and added to the membrane potential of the neuron 230. The temporal correlations between the presynaptic input spikes and the neuronal firing events result in an evolution of the synaptic weights due to a feedback-driven competition among the synapses 211-214. In the steady state, the correlations between the individual input streams can be inferred from the distribution of the synaptic weights or the resulting firing activity of the postsynaptic neuron 230.

Synapses with FSTDP can be implemented as a combination of one of various forms of fatigue with one of various forms of STDP. A rate-based fatigue component can be implemented such that fatigue increases with an increase in the pre-synaptic input rate R(t). For example, the fatigue component may have the form:

$$F(t) = 1 - \frac{1}{R(t) + 1}.$$

The rate may be calculated as a mean over a time window in the past. This mean calculation can weight recent inputs more than distant ones.

Alternatively, a spike-based fatigue component can be implemented. In this approach, the fatigue component is given as:

$$F(t) = f(t - t^{sp_n}) + F(t^{sp_n}),$$

where $t^{sp_n}$ is the timing of the last presynaptic spike prior to t. The function f(x) can be implemented as:

step:

$$f(x) = \begin{cases} a, & 0 < x < x_{window} \\ 0, & x \geq x_{window} \end{cases}, a \in (0, 1],$$

linear:

$$f(x) = 1 - ax, a > 0,$$

exponential: $f(x)=1-ae^{-x}$, $a>0$, or any decreasing function.

The STDP component can be implemented using any of a number of approaches, such as a classic STDP, a triplet rule, a Fusi rule, or other alternatives.

FSTDP allows for low-rate correlation detection. The necessary and sufficient conditions for successful correlation detection with a spike-timing-based plasticity is that the expected value of the weight updates for temporally correlated synapses be positive, i.e., that the probability of their potentiation exceed the probability of their depression, and vice versa for uncorrelated synapses:

$$E[\Delta W_{cor}] > 0, E[\Delta W_{uncor}] < 0.$$

This necessitates that the probability that each presynaptic spike of a synapse will bring the postsynaptic neuron to its firing threshold Vth, causing a postsynaptic spike is higher for temporally correlated spike inputs than for the other inputs, even if the latter include rate correlations. The use of fatigue in FSTDP increases the potential that the membrane needs to be at for a presynaptic spike to cause it to fire, and this effect of FSTDP is smaller on low-rate inputs than on high-rate inputs. Thus, with FSTDP the probability of firing and potentiation due to an input spike from a "correlated" synapse is higher than that due to spikes from "uncorrelated" synapses, even if the latter have high, correlated rates.

The above described FSTDP circuits can be implemented as software simulations or as hardware emulations. Neural networks with any variation of FSTDP can be simulated in software on a variety of hardware platforms, such as CPU based systems, including architectures such as SpiNNaker, GPU based systems, or AI accelerators with synaptic dynamics. Simulated learning that updates programmable synapses on neuromorphic hardware can also be used as well as learning simulated off-chip, such as in IBM TrueNorth or CxQuad. (Note: the term(s) "SpiNNaker," "IBM," "TrueNorth," and/or "CxQuad" may be subject to trademark rights in various jurisdictions throughout the world and are used here only in reference to the products or services properly denominated by the marks to the extent that such trademark rights may exist.)

FSTDP can also be emulated in neuromorphic hardware with spike-timing-dependent long-term dynamics and with depressing short-term synaptic dynamics, either in analog complementary metal-oxide semiconductor (CMOS) or digital CMOS. Phase change memory or resistive memory, combined with transistors, can implement STDP. The use of phase change memory has been implemented for 2T-1R and for 1T-1R. A signal provided to the gate of a transistor, as part of each pre-synaptic spike, can shape the amount of current passing through, according to a fatigue rule defined by additional synaptic circuitry on-chip, or off-chip. Additionally, a non-volatile memory element with volatile characteristics that match a form of fatigue. Volatility used for short-term fatiguing effect, non-volatility for long-term STDP weight update. conventionally, long-term plasticity is combined with certain forms of short-term plasticity (but not fatigue), emulated through matching volatile dynamics.

The present invention, in embodiments, may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the present invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing written description of the present invention enables one of ordinary skill to make and use what is considered presently to be the best mode thereof, those of ordinary skill will understand and appreciate the existence of alternatives, adaptations, variations, combinations, and equivalents of the specific embodiment, method, and examples herein. Those skilled in the art will appreciate that the within disclosures are exemplary only and that various modifications may be made within the scope of the present invention. In addition, while a particular feature of the teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the teachings will be apparent to those skilled in the art from consideration of the specification and practice of the teachings disclosed herein. The present invention should therefore not be limited by the described embodiment, method, and examples, but by all embodiments and methods within the scope and spirit of the present invention. Accordingly, the present invention is not limited to the specific embodiments as illustrated herein, but is only limited by the following claims.

Some helpful definitions follow:

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

User/subscriber: includes, but is not necessarily limited to, the following: (i) a single individual human; (ii) an artificial intelligence entity with sufficient intelligence to act as a user or subscriber; and/or (iii) a group of related users or subscribers.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

What is claimed is:

1. An apparatus comprising:
   circuitry comprising:
   at least one presynaptic artificial neuron configured to generate a sequence of presynaptic spikes; and
   a postsynaptic artificial neuron configured to receive the sequence of presynaptic spikes, the postsynaptic artificial neuron comprising:
   a postsynaptic membrane potential; and
   at least one fatiguing plastic synapse connected to the postsynaptic membrane potential;
   wherein the at least one fatiguing plastic synapses comprises:
   an efficacy having a spike-timing-dependent plasticity; and
   a fatiguing circuit,
   wherein the fatiguing circuit reduces the efficacy using a fatigue plasticity rule based on the sequence of presynaptic spikes, and
   wherein the fatigue plasticity rule comprises a function:

$$F(t) = 1 - 1/(R(t) + 1),$$

wherein R(t) is a spike rate at time t.

2. The apparatus of claim 1, wherein the spike rate comprises a mean over a time window.

3. The apparatus of claim 1, wherein
   the sequence of presynaptic spikes is characterized by the spike rate, and
   the fatiguing circuit, using the fatigue plasticity rule, is configured to modify the efficacy so that each spike in the sequence of presynaptic spikes has a reduced effect on the postsynaptic membrane potential when the spike rate increases.

4. The apparatus of claim 1, wherein the at least one fatiguing plastic synapse comprises a transistor having a gate, wherein the sequence of presynaptic spikes are input into the gate so as to modify an amount of current passing through the transistor.

5. The apparatus of claim 4, wherein the modifying the amount of current passing through the transistor is in accordance with the fatigue plasticity rule.

6. The apparatus of claim 1, wherein the at least one fatiguing plastic synapse comprises a non-volatile memory element with volatile characteristics that match a form of fatigue.

7. The apparatus of claim 1, wherein the at least one fatiguing plastic synapse comprises a digital complementary metal-oxide semiconductor (CMOS) circuit or an analog CMOS circuit.

8. An apparatus comprising:
   circuitry comprising:
   at least one presynaptic artificial neuron configured to generate a sequence of presynaptic spikes; and
   a postsynaptic artificial neuron configured to receive the sequence of presynaptic spikes, the postsynaptic artificial neuron comprising:
   a postsynaptic membrane potential; and
   at least one fatiguing plastic synapse connected to the postsynaptic membrane potential;
   wherein the at least one fatiguing plastic synapses comprises:
   an efficacy having a spike-timing-dependent plasticity; and
   a fatiguing circuit,
   wherein the fatiguing circuit reduces the efficacy using a fatigue plasticity rule based on the sequence of presynaptic spikes, and
   wherein the fatiguing plasticity rule comprises a function:

$$F(t) = f(t - t^{sp_n}) + F(t^{sp_n}).$$

wherein f(x) is a decreasing function, $t^{sp_n}$ is a timing of the last presynaptic spike prior to t, F (t) is a function that depends on a time of arrival of the presynaptic spikes.

9. The apparatus of claim 8, wherein:

$$f(x) = \begin{cases} a, & 0 < x < x_{window} \\ 0, & x \geq x_{window} \end{cases}, a \in (0, 1].$$

10. The apparatus of claim 8, wherein:

$$f(x) = 1 - ax, a > 0 \text{ or } f(x) = 1 - ae^{-x}, a > 0.$$

11. The apparatus of claim 8, wherein
    the sequence of presynaptic spikes is characterized by the spike rate, and
    the fatiguing circuit, using the fatigue plasticity rule, is configured to modify the efficacy so that each spike in the sequence of presynaptic spikes has a reduced effect on the postsynaptic membrane potential when the spike rate increases.

12. The apparatus of claim 8, wherein the at least one fatiguing plastic synapse comprises a transistor having a gate, wherein the sequence of presynaptic spikes are input into the gate so as to modify an amount of current passing through the transistor.

13. The apparatus of claim 12, wherein the modifying the amount of current passing through the transistor is in accordance with the fatigue plasticity rule.

14. The apparatus of claim 8, wherein the at least one fatiguing plastic synapse comprises a non-volatile memory element with volatile characteristics that match a form of fatigue.

15. The apparatus of claim 8, wherein the at least one fatiguing plastic synapse comprises a digital complementary metal-oxide semiconductor (CMOS) circuit or an analog CMOS circuit.

* * * * *